(12) United States Patent
Haba et al.

(10) Patent No.: US 10,008,477 B2
(45) Date of Patent: Jun. 26, 2018

(54) MICROELECTRONIC ELEMENT WITH BOND ELEMENTS TO ENCAPSULATION SURFACE

(71) Applicant: Invensas Corporation, San Jose, CA (US)

(72) Inventors: Belgacem Haba, Saratoga, CA (US); Richard Dewitt Crisp, Hornitos, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days. days.

(21) Appl. No.: 15/286,086

(22) Filed: Oct. 5, 2016

(65) Prior Publication Data

US 2017/0025390 A1    Jan. 26, 2017

Related U.S. Application Data

(62) Division of application No. 14/027,571, filed on Sep. 16, 2013, now abandoned.

(51) Int. Cl.
*H01L 21/48* (2006.01)
*H01L 23/29* (2006.01)
(Continued)

(52) U.S. Cl.
CPC ...... *H01L 25/0657* (2013.01); *H01L 21/4846* (2013.01); *H01L 23/293* (2013.01);
(Continued)

(58) Field of Classification Search
CPC ....... H01L 2924/01079; H01L 2924/14; H01L 2924/01013; H01L 2924/01029;
(Continued)

(56) References Cited

U.S. PATENT DOCUMENTS 2,230,663 A    2/1941   Alden
3,289,452 A   12/1966   Koellner
(Continued)

FOREIGN PATENT DOCUMENTS

CN    1352804 A    6/2002
CN    1641832 A    7/2005
(Continued)

OTHER PUBLICATIONS

International Search Report and Written Opinion for Application No. PCT/US2014/055695 dated Mar. 20, 2015.
(Continued)

*Primary Examiner* — Didarul Mazumder
(74) *Attorney, Agent, or Firm* — Lerner, David, Littenberg, Krumholz & Mentlik, LLP

(57) ABSTRACT

A microelectronic structure includes a semiconductor having conductive elements at a first surface. Wire bonds have bases joined to the conductive elements and free ends remote from the bases, the free ends being remote from the substrate and the bases and including end surfaces. The wire bonds define edge surfaces between the bases and end surfaces thereof. A compliant material layer extends along the edge surfaces within first portions of the wire bonds at least adjacent the bases thereof and fills spaces between the first portions of the wire bonds such that the first portions of the wire bonds are separated from one another by the compliant material layer. Second portions of the wire bonds are defined by the end surfaces and portions of the edge surfaces adjacent the end surfaces that are extend from a third surface of the compliant later.

12 Claims, 7 Drawing Sheets

(51) Int. Cl.
*H01L 23/31* (2006.01)
*H01L 23/49* (2006.01)
*H01L 21/56* (2006.01)
*H01L 25/065* (2006.01)
*H01L 23/00* (2006.01)
*H01L 25/00* (2006.01)

(52) U.S. Cl.
CPC .......... *H01L 23/3171* (2013.01); *H01L 23/49* (2013.01); *H01L 24/11* (2013.01); *H01L 24/13* (2013.01); *H01L 24/742* (2013.01); *H01L 24/745* (2013.01); *H01L 25/50* (2013.01); *H01L 21/565* (2013.01); *H01L 23/3128* (2013.01); *H01L 24/16* (2013.01); *H01L 24/81* (2013.01); *H01L 2224/0401* (2013.01); *H01L 2224/05555* (2013.01); *H01L 2224/05571* (2013.01); *H01L 2224/05572* (2013.01); *H01L 2224/05573* (2013.01); *H01L 2224/05644* (2013.01); *H01L 2224/05647* (2013.01); *H01L 2224/05655* (2013.01); *H01L 2224/1134* (2013.01); *H01L 2224/1184* (2013.01); *H01L 2224/1191* (2013.01); *H01L 2224/131* (2013.01); *H01L 2224/13005* (2013.01); *H01L 2224/13012* (2013.01); *H01L 2224/13013* (2013.01); *H01L 2224/13014* (2013.01); *H01L 2224/13017* (2013.01); *H01L 2224/13022* (2013.01); *H01L 2224/1357* (2013.01); *H01L 2224/1369* (2013.01); *H01L 2224/13076* (2013.01); *H01L 2224/13124* (2013.01); *H01L 2224/13144* (2013.01); *H01L 2224/13147* (2013.01); *H01L 2224/13155* (2013.01); *H01L 2224/13624* (2013.01); *H01L 2224/13655* (2013.01); *H01L 2224/14051* (2013.01); *H01L 2224/16105* (2013.01); *H01L 2224/16108* (2013.01); *H01L 2224/16145* (2013.01); *H01L 2224/16225* (2013.01); *H01L 2224/16227* (2013.01); *H01L 2224/1703* (2013.01); *H01L 2224/17051* (2013.01); *H01L 2224/32145* (2013.01); *H01L 2224/73103* (2013.01); *H01L 2224/73203* (2013.01); *H01L 2224/73253* (2013.01); *H01L 2224/742* (2013.01); *H01L 2224/81191* (2013.01); *H01L 2224/81193* (2013.01); *H01L 2224/81815* (2013.01); *H01L 2224/9202* (2013.01); *H01L 2224/92142* (2013.01); *H01L 2224/92143* (2013.01); *H01L 2224/97* (2013.01); *H01L 2225/06506* (2013.01); *H01L 2225/06513* (2013.01); *H01L 2225/06517* (2013.01); *H01L 2225/06555* (2013.01); *H01L 2225/06568* (2013.01); *H01L 2225/06582* (2013.01); *H01L 2225/06589* (2013.01); *H01L 2924/12042* (2013.01); *H01L 2924/181* (2013.01)

(58) Field of Classification Search
CPC ....... H01L 2224/48091; H01L 25/0657; H01L 21/4846; H01L 23/293; H01L 23/3171; H01L 23/49; H01L 24/11; H01L 24/13; H01L 24/742; H01L 24/745; H01L 25/50; H01L 21/565; H01L 23/3128; H01L 24/16; H01L 24/81; H01L 2224/0401; H01L 2224/05555; H01L 2224/05571; H01L 2224/05647; H01L 2224/05655; H01L 2224/1134; H01L 2224/1184; H01L 2224/1191; H01L 2224/13005; H01L 2224/13012; H01L 2224/13013; H01L 2224/13014; H01L 2224/13017; H01L 2224/13022; H01L 2224/13076; H01L 2224/131; H01L 2224/13155; H01L 2224/1357; H01L 2224/13624; H01L 2224/13566; H01L 2224/1369; H01L 2224/14051; H01L 2224/16105; H01L 2224/16108; H01L 2224/16145; H01L 2224/16225; H01L 2224/16227; H01L 2224/1703; H01L 2224/17051; H01L 2224/03
USPC .......................................... 257/784; 438/617
See application file for complete search history.

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |

(56) References Cited

U.S. PATENT DOCUMENTS

| | | |
|---|---|---|
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 * | 10/2001 | Beaman ............... B23K 20/004 228/180.5 |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,476,503 B1 | 11/2002 | Imamura et al. |
| 6,476,506 B1 | 11/2002 | O'Connor et al. |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,741,085 B1 | 5/2004 | Khandros et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chillipeddi et al. |
| 6,812,575 B2 | 11/2004 | Furusawa |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |

(56) References Cited

U.S. PATENT DOCUMENTS

| | | |
|---|---|---|
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,287,322 B2 | 10/2007 | Mathieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,323,767 B2 | 1/2008 | James et al. |
| 7,327,038 B2 | 2/2008 | Kwon et al. |
| 7,344,917 B2 | 3/2008 | Gautham |
| 7,355,289 B2 | 4/2008 | Hess et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,621,436 B2 | 11/2009 | Mii et al. |
| 7,625,781 B2 | 12/2009 | Beer |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,857,190 B2 | 12/2010 | Takahashi et al. |
| 7,872,335 B2 | 1/2011 | Khan et al. |
| 7,880,290 B2 | 2/2011 | Park |
| 7,892,889 B2 | 2/2011 | Howard et al. |
| 7,902,644 B2 | 3/2011 | Huang et al. |
| 7,910,385 B2 | 3/2011 | Kweon et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 8,008,121 B2 | 8/2011 | Choi et al. |
| 8,012,797 B2 | 9/2011 | Shen et al. |
| 8,018,065 B2 | 9/2011 | Lam |
| 8,020,290 B2 | 9/2011 | Sheats |
| 8,035,213 B2 | 10/2011 | Lee et al. |
| 8,039,316 B2 | 10/2011 | Chi et al. |
| 8,039,970 B2 | 10/2011 | Yamamori et al. |
| 8,053,814 B2 | 11/2011 | Chen et al. |
| 8,053,879 B2 | 11/2011 | Lee et al. |
| 8,058,101 B2 | 11/2011 | Haba et al. |
| 8,071,424 B2 | 12/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,115,283 B1 | 2/2012 | Bolognia et al. |
| 8,120,054 B2 | 2/2012 | Seo et al. |
| 8,138,584 B2 | 3/2012 | Wang et al. |

(56) References Cited

U.S. PATENT DOCUMENTS

| | | |
|---|---|---|
| 8,174,119 B2 | 5/2012 | Pendse |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,288,854 B2 | 10/2012 | Weng et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,319,338 B1 | 11/2012 | Berry et al. |
| 8,324,633 B2 | 12/2012 | McKenzie et al. |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,395,259 B2 | 3/2013 | Eun |
| 8,399,972 B2 | 3/2013 | Hoang et al. |
| 8,404,520 B1 | 3/2013 | Chau et al. |
| 8,415,704 B2 | 4/2013 | Ivanov et al. |
| 8,419,442 B2 | 4/2013 | Horikawa et al. |
| 8,476,770 B2 | 7/2013 | Shao et al. |
| 8,482,111 B2 | 7/2013 | Haba |
| 8,507,297 B2 | 8/2013 | Pan et al. |
| 8,508,045 B2 | 8/2013 | Khan et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,392 B2 | 10/2013 | Chua et al. |
| 8,618,659 B2 | 12/2013 | Sato et al. |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,659,164 B2 | 2/2014 | Haba |
| 8,669,646 B2 | 3/2014 | Tabatabai et al. |
| 8,670,261 B2 | 3/2014 | Crisp et al. |
| 8,680,677 B2 | 3/2014 | Wyland |
| 8,680,684 B2 | 3/2014 | Haba et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson et al. |
| 8,766,436 B2 | 7/2014 | DeLucca et al. |
| 8,772,152 B2 | 7/2014 | Co et al. |
| 8,772,817 B2 | 7/2014 | Yao |
| 8,791,575 B2 | 7/2014 | Oganesian et al. |
| 8,791,580 B2 | 7/2014 | Park et al. |
| 8,802,494 B2 | 8/2014 | Lee et al. |
| 8,811,055 B2 | 8/2014 | Yoon |
| 8,816,404 B2 | 8/2014 | Kim et al. |
| 8,835,228 B2 | 9/2014 | Mohammed |
| 8,836,136 B2 | 9/2014 | Chau et al. |
| 8,836,147 B2 | 9/2014 | Uno et al. |
| 8,841,765 B2 | 9/2014 | Haba et al. |
| 8,878,353 B2 | 11/2014 | Haba et al. |
| 8,893,380 B2 | 11/2014 | Kim et al. |
| 8,907,466 B2 | 12/2014 | Haba |
| 8,907,500 B2 | 12/2014 | Haba et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,975,726 B2 | 3/2015 | Chen et al. |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,012,263 B1 | 4/2015 | Mathew et al. |
| 9,054,095 B2 | 6/2015 | Pagaila |
| 9,093,435 B2 | 7/2015 | Sato et al. |
| 9,095,074 B2 | 7/2015 | Haba et al. |
| 9,105,483 B2 | 8/2015 | Chau et al. |
| 9,117,811 B2 | 8/2015 | Zohni |
| 9,123,664 B2 | 9/2015 | Haba |
| 9,136,254 B2 | 9/2015 | Zhao et al. |
| 9,153,562 B2 | 10/2015 | Haba et al. |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,263,394 B2 | 2/2016 | Uzoh et al. |
| 9,263,413 B2 | 2/2016 | Mohammed |
| 9,318,452 B2 | 4/2016 | Chen et al. |
| 9,324,696 B2 | 4/2016 | Choi et al. |
| 9,330,945 B2 | 5/2016 | Song et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,508,622 B2 | 11/2016 | Higgins, III |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,653,442 B2 | 5/2017 | Yu et al. |
| 9,659,877 B2 | 5/2017 | Bakalski et al. |
| 9,663,353 B2 | 5/2017 | Ofner et al. |
| 9,735,084 B2 | 8/2017 | Katkar et al. |
| 9,788,466 B2 | 10/2017 | Chen |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0027257 A1 | 3/2002 | Kinsman et al. |
| 2002/0066952 A1 | 6/2002 | Taniguchi et al. |
| 2002/0096787 A1 | 7/2002 | Fjelstad |
| 2002/0113308 A1 | 8/2002 | Huang et al. |
| 2002/0117330 A1* | 8/2002 | Eldridge ............... B23K 20/004 174/260 |
| 2002/0125556 A1 | 9/2002 | Oh et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |

(56) References Cited

U.S. PATENT DOCUMENTS

| | | |
|---|---|---|
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Kamezos et al. |
| 2004/0124518 A1 | 7/2004 | Kamezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Kamezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0161814 A1 | 7/2005 | Mizukoshi et al. |
| 2005/0173805 A1 | 8/2005 | Damberg et al. |
| 2005/0173807 A1 | 8/2005 | Zhu et al. |
| 2005/0176233 A1 | 8/2005 | Joshi et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0087013 A1 | 4/2006 | Hsieh |
| 2006/0118641 A1 | 6/2006 | Hwang et al. |
| 2006/0139893 A1* | 6/2006 | Yoshimura .......... H01L 25/0657 361/735 |
| 2006/0166397 A1 | 7/2006 | Lau et al. |
| 2006/0197220 A1 | 9/2006 | Beer |
| 2006/0216868 A1 | 9/2006 | Yang et al. |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0010086 A1 | 1/2007 | Hsieh |
| 2007/0013067 A1 | 1/2007 | Nishida et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0080360 A1 | 4/2007 | Mirsky et al. |
| 2007/0090524 A1 | 4/2007 | Abbott |
| 2007/0126091 A1 | 6/2007 | Wood et al. |
| 2007/0145563 A1 | 6/2007 | Punzalan et al. |
| 2007/0148822 A1 | 6/2007 | Haba et al. |
| 2007/0164457 A1 | 7/2007 | Yamaguchi et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0029849 A1 | 2/2008 | Hedler et al. |
| 2008/0032519 A1 | 2/2008 | Murata |
| 2008/0042265 A1 | 2/2008 | Merilo et al. |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0110667 A1 | 5/2008 | Ahn et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0217708 A1 | 9/2008 | Reisner et al. |
| 2008/0230887 A1 | 9/2008 | Sun et al. |
| 2008/0277772 A1 | 11/2008 | Groenhuis et al. |
| 2008/0280393 A1 | 11/2008 | Lee et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0008796 A1 | 1/2009 | Eng et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |

(56) References Cited

U.S. PATENT DOCUMENTS

| | | |
|---|---|---|
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0260228 A1 | 10/2009 | Val |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0072588 A1 | 3/2010 | Yang |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0216281 A1 | 8/2010 | Pagaila et al. |
| 2010/0224975 A1 | 9/2010 | Shin et al. |
| 2010/0232119 A1 | 9/2010 | Schmidt et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0042699 A1 | 2/2011 | Park et al. |
| 2011/0057308 A1 | 3/2011 | Choi et al. |
| 2011/0068453 A1 | 3/2011 | Cho et al. |
| 2011/0068478 A1 | 3/2011 | Pagaila et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0156249 A1 | 6/2011 | Chang et al. |
| 2011/0157834 A1 | 6/2011 | Wang |
| 2011/0175213 A1 | 7/2011 | Mori et al. |
| 2011/0209908 A1 | 9/2011 | Lin et al. |
| 2011/0215472 A1 | 9/2011 | Chandrasekaran |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0001336 A1 | 1/2012 | Zeng et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0126431 A1 | 5/2012 | Kim et al. |
| 2012/0145442 A1 | 6/2012 | Gupta et al. |
| 2012/0146235 A1 | 6/2012 | Choi et al. |
| 2012/0153444 A1 | 6/2012 | Haga et al. |
| 2012/0184116 A1 | 7/2012 | Pawlikowski et al. |
| 2012/0280374 A1 | 11/2012 | Choi et al. |
| 2012/0280386 A1* | 11/2012 | Sato ............... H01L 23/3121 257/737 |
| 2012/0326337 A1 | 12/2012 | Camacho et al. |
| 2013/0001797 A1 | 1/2013 | Choi et al. |
| 2013/0032944 A1 | 2/2013 | Sato et al. |
| 2013/0037802 A1 | 2/2013 | England et al. |
| 2013/0040423 A1* | 2/2013 | Tung ............... H01L 23/3114 438/107 |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0087915 A1 | 4/2013 | Warren et al. |
| 2013/0093087 A1* | 4/2013 | Chau ............... H01L 23/49517 257/738 |
| 2013/0093088 A1 | 4/2013 | Chau et al. |
| 2013/0093091 A1 | 4/2013 | Ma et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0153646 A1 | 6/2013 | Ho |
| 2013/0182402 A1 | 7/2013 | Chen et al. |
| 2013/0200524 A1 | 8/2013 | Han et al. |
| 2013/0200533 A1 | 8/2013 | Chau et al. |
| 2013/0234317 A1 | 9/2013 | Chen et al. |
| 2013/0241083 A1 | 9/2013 | Yu et al. |
| 2013/0256847 A1 | 10/2013 | Park et al. |
| 2013/0313716 A1 | 11/2013 | Mohammed |
| 2013/0323409 A1 | 12/2013 | Read et al. |
| 2014/0021605 A1 | 1/2014 | Yu et al. |
| 2014/0035892 A1 | 2/2014 | Shenoy et al. |
| 2014/0036454 A1 | 2/2014 | Caskey et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0220744 A1 | 8/2014 | Damberg et al. |
| 2014/0225248 A1 | 8/2014 | Henderson et al. |
| 2014/0239479 A1 | 8/2014 | Start |
| 2014/0239490 A1 | 8/2014 | Wang |
| 2014/0264945 A1 | 9/2014 | Yap et al. |
| 2014/0312503 A1 | 10/2014 | Seo |
| 2015/0017765 A1 | 1/2015 | Co et al. |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0225692 A1 | 8/2016 | Kim et al. |
| 2017/0117231 A1 | 4/2017 | Awujoola et al. |
| 2017/0229432 A1 | 8/2017 | Lin et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |

(56) References Cited

FOREIGN PATENT DOCUMENTS

| | | |
|---|---|---|
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2000323516 A | 11/2000 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2003318327 A | 11/2003 |
| JP | 2004031754 A | 1/2004 |
| JP | 200447702 | 2/2004 |
| JP | 2004047702 A | 2/2004 |
| JP | 2004048048 A | 2/2004 |
| JP | 2004-172157 A | 6/2004 |
| JP | 2004200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 | 12/2007 |
| JP | 2007335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20070058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Preliminary Report on Patentability, Chapter II, for Application No. PCT/US2014/055695 dated Dec. 15, 2015.
International Search Report and Written Opinion for Application No. PCT/US2014/050148 dated Feb. 9, 2015.
Partial International Search Report for Application No. PCT/US2014/014181 dated May 8, 2014.
International Search Report and Written Opinion for Application No. PCT/US2014/014181 dated Jun. 13, 2014.
Taiwanese Office Action for Application No. 103103350 dated Mar. 21, 2016.
U.S. Appl. No. 13/477,532, filed May 22, 2012.
International Search Report and Written Opinion for Application No. PCT/US2014/050125 dated Feb. 4, 2015.
Written Opinion for Application No. PCT/US2014/050125 dated Jul. 15, 2015.

(56) References Cited

OTHER PUBLICATIONS

Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, dated Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2001.
International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, Stats ChipPAC LTD.
Search Report from Korean Patent Applicatin No. 10-2010-0113271 dated Jan. 12, 2011.
International Search Report and Written Opinion for PCT/US2011/060551 dated Apr. 18, 2012.
Meiser 5, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2011.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 dated May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.
International Search Report for Application No. PCT/US2015/032679, dated Nov. 11, 2015, 2 pages.
International Search Report for Application No. PCT/US2016/056402, dated Jan. 31, 2017, 3 pages.
International Search Report for Application No. PCT/US2016/056526, dated Jan. 20, 2017, 3 pages.
International Search Report for Application No. PCT/US2016/068297, dated Apr. 17, 2017, 3 pages.
Partial International Search Report for Application No. PCT/US2015/032679, dated Sep. 4, 2015, 2 pages.
Brochure, "High Performance BVA PoP Package for Mobile Systems," Invensas Corporation, May 2013, 20 pages.
Brochure, "Invensas BVA PoP for Mobile Computing: 100+ GB/s BVA PoP," Invensas Corporation, c. 2012, 2 pages.
Brochure, "Invensas BVA PoP for Mobile Computing: Ultra High IO Without TSVs," Invensas Corporation, Jun. 26, 2012, 4 pages.
Campos et al., "System in Package Solutions Using Fan-Out Wafer Level Packaging Technology," SEMI Networking Day, Jun. 27, 2013, 31 pages.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
NTK HTCC Package General Design Guide, Communication Media Components Group, NGK Spark Plug Co., Ltd., Komaki, Aichi, Japan, Apr. 2010, 32 pages.
Taiwanese Search Report for Application No. TW105128420 dated Sep. 26, 2017.

* cited by examiner

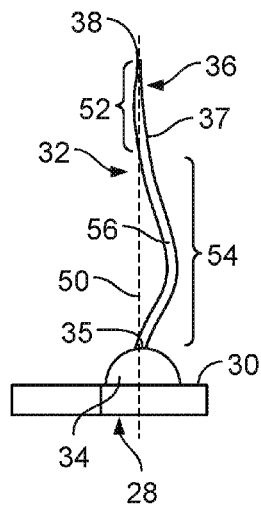 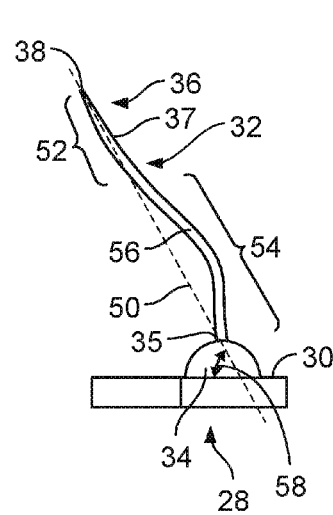 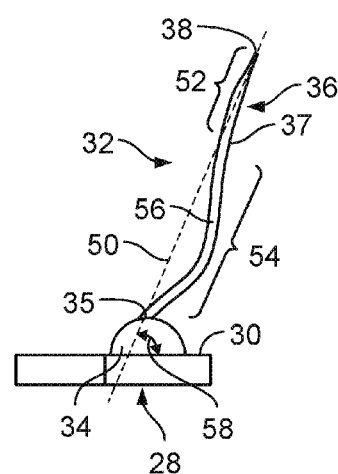
FIG. 3A  FIG. 3B  FIG. 3C
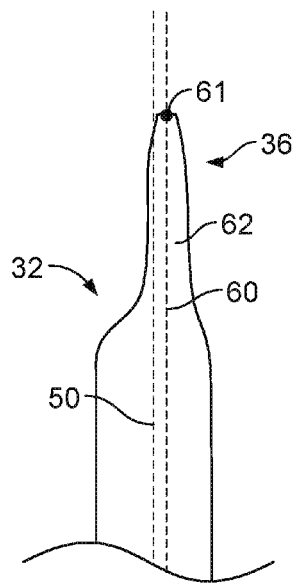
FIG. 4

MICROELECTRONIC ELEMENT WITH BOND ELEMENTS TO ENCAPSULATION SURFACE

CROSS-REFERENCE TO RELATED APPLICATIONS

The present application is a divisional of U.S. patent application Ser. No. 14/027,571, filed on Sep. 16, 2013, the disclosure of which is incorporated herein by reference.

BACKGROUND OF THE INVENTION

The subject matter of the present application relates to a microelectronic element including a semiconductor chip with structures to achieve improved reliability when assembled with external microelectronic components, including compliant connection structures, and methods of fabricating the microelectronic element.

Semiconductor chips are flat bodies with contacts disposed on a front surface that are connected to internal electrical circuitry of the chip. The chips are typically packaged to form a microelectronic package having terminals that are electrically connected to the chip contacts. The terminals of the package may then be connected to an external microelectronic component, such as a circuit panel.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Mismatches or differences between coefficients of thermal expansion ("CTE") of the components in such a package can adversely impact their reliability and performance. In an example, a semiconductor chip may have a lower CTE than that of a substrate or printed circuit board to which it is mounted. As the chip undergoes heating and cooling due to the use cycle thereof, the components will expand and contract according to their differing CTEs. In this example, the substrate will expand more and at a greater rate than the semiconductor die. This can cause stress in the solder masses (or other structures) used to both mount and electrically connect the semiconductor die and the substrate. Such stress can cause the solder mass to disconnect from either or both of the semiconductor die or the substrate, thereby interrupting the signal transmission that it otherwise facilitates. Various structures have been used to compensate for such variations in CTE, yet many fail to offer a significant amount of compensation on a scale appropriate for the fine pitch arrays being increasingly utilized in microelectronic packages.

BRIEF SUMMARY OF THE INVENTION

An aspect of the present disclosure relates to a microelectronic structure including a first semiconductor die having first and second oppositely facing surfaces and a plurality of electrically conductive elements at the first surface. The structure also includes wire bonds having bases joined to respective ones of the conductive elements. The wire bonds further have free ends remote from the bases, the free ends being remote from the substrate and the bases and including end surfaces thereon. The wire bonds define edge surfaces extending between the bases and end surfaces thereof. A compliant material layer overlies and extends from the first surface of the semiconductor die outside of the bases of the wire bonds. The compliant material layer further extends along first portions of the edge surfaces of the wire bonds at least adjacent the bases thereof and fills spaces between the first portions of the wire bonds such that the first portions of the wire bonds are separated from one another by the compliant material layer. The compliant material layer further has a third surface facing away from the first surface of the semiconductor die. Second portions of the wire bonds are defined by the end surfaces and portions of the edge surfaces adjacent the end surfaces that are uncovered by the third surface and extend away therefrom.

The first portions of the wire bonds can be encapsulated entirely by the compliant material. Further, the second portions of the wire bonds can be moveable with respect to the bases thereof. In an example, the compliant material layer can have a Young's modulus of 2.5 GPa or less.

The second portions of the wire bonds can extend along axes of the wire bonds that are disposed at angles of at least 30 degrees with respect to the third surface. The end surfaces of the wire bonds can be positioned above the third surface by a distance of at least 50 microns. Further, the end surfaces of the wire bonds can be positioned above the third surface at a distance of less than 200 microns.

The semiconductor die can further define edge surfaces extending between the first and second surfaces, and the compliant material layer can further include edge surfaces extending from the third surface thereof to the first surface of the semiconductor die so as to be substantially coplanar with the edge surfaces of the semiconductor die. At least one of the wire bonds can have a shape such that the wire bond defines an axis between the free end and the base thereof and such that the wire bond defines a plane. In such an example a bent portion of the at least one wire bond can extending away from the axis within the plane. The shape of the at least one wire bond can be further such that a substantially straight portion of the wire bond extends between the free end and the bent portion along the axis.

The microelectronic structure can further include conductive metal masses joined with the second portions of the wire bonds and contacting the third surface of the compliant material layer. In such an example, at least one of the conductive metal masses encapsulates at least some of the second portion of a respective one of the wire bonds. The conductive metal masses can be configured to join the second portions of the wire bonds with external conductive features by reflow thereof.

In an example, the semiconductor die can be a first semiconductor die having a first region and a second region surrounding the first region. The electrically conductive elements of the first semiconductor die can be within the second region. The microelectronic structure in such an example, can further include a second semiconductor die mounted on the first semiconductor die within the first region. The second semiconductor die can be electrically connected with at least some of the conductive elements of the first semiconductor die. The compliant material layer can cover the second semiconductor die.

In another example, the semiconductor die can be a first semiconductor die having a first region and a second region surrounding the first region. The electrically conductive elements of the first semiconductor die can be within the second region. The microelectronic structure can further include a second semiconductor die mounted on the first semiconductor die within the first region. The second semiconductor die can have first and second oppositely facing surfaces and a plurality of electrically conductive elements at the first surface facing away from the first surface of the first semiconductor die. Additional wire bonds can have bases joined to respective ones of the conductive elements of the second semiconductor die. The additional wire bonds can further have free ends remote from the bases, and the free ends can be remote from the first surface of the second semiconductor die and the bases and including the end surfaces thereon. The wire bonds can define edge surfaces extending between the bases and end surfaces thereof. The compliant material layer can further overlie and extend from the first surface of the second semiconductor die outside of the bases of the additional wire bonds, and the compliant material layer can further extending along first portions of the edge surfaces of the additional wire bonds. Second portions of the additional wire bonds can be defined by the end surfaces and portions of the edge surfaces extending from the end surfaces that are uncovered by and extend away from the compliant material layer at the third surface.

Another aspect of the present disclosure can relate to a microelectronic package including a microelectronic element having a first semiconductor die with first and second oppositely facing surfaces and a plurality of electrically conductive elements at the first surface. The element can further have wire bonds with bases joined to respective ones of the conductive elements at the first surface and end surfaces, the end surfaces being remote from the substrate and the bases. Each of the wire bonds extends from the base to the end surface thereof. A compliant material layer overlies and extends from the first portion of the first surface of the substrate and fills spaces between first portions of the wire bonds such that the first portions of the wire bonds are separated from one another by the compliant material layer. The compliant material layer has a third surface facing away from the first surface of the substrate, and second portions of the wire bonds are defined by at least portions of the end surfaces of the wire bonds that are uncovered by the compliant material layer at the third surface. The package further includes a substrate having a fourth surface and a plurality of terminals exposed at the fourth surface. The microelectronic element is mounted on the substrate with the third surface facing the fourth surface and at least some of the wire bonds are joined, at the second portions thereof, to respective ones of the terminals.

The second portions of the wire bonds can be electrically and mechanically joined to the terminals by conductive metal masses. The microelectronic package can further include a molded dielectric layer formed over at least a portion of the fourth surface of the substrate and extending away therefrom so as to extend along at least a portion of the microelectronic element. The Young's modulus of the molded dielectric layer can be greater than the Young's Modulus of the compliant material layer. The compliant material layer can have a Young's modulus of less than 2.5 GPa.

The wire bonds can further define edge surfaces extending between the bases and end surfaces thereof, and the compliant material layer can extend along portions of the edge surfaces of the wire bonds at least adjacent the bases thereof and within the first portions of the wire bonds. Portions of the edge surfaces of the wire bonds that extend from the end surfaces thereof can be uncovered by the compliant material layer around entire circumferences thereof at the third surface thereof.

Another aspect of the present disclosure relates to a method for making a microelectronic structure. The method includes forming wire bonds on a semiconductor die, the semiconductor die having first and second oppositely facing surfaces and a plurality of electrically conductive elements at the first surface. The wire bonds are formed having bases joined to respective ones of the conductive elements and having end surfaces remote from the substrate and the bases. Edge surfaces of the wire bonds extend between the bases and the end surfaces. The method further includes forming a compliant material layer overlying and extending from the first surface of the semiconductor die outside of the bases of the wire bonds. The compliant material is further formed to extend along portions of the edge surfaces of first portions of the wire bonds to fill spaces between the first portions of the wire bonds and to separate the first portions of the wire bonds from one another. The compliant material layer is further formed to have a third surface facing away from the first surface of the substrate with second portions of the wire bonds being defined by at least the end surfaces and portions of the edge surfaces of the wire bonds that are uncovered by the conductive material layer at the third surface so as to extend away therefrom.

The method can further include the step of mounting the microelectronic package on a substrate with the third surface facing a surface of the substrate. The surface of the substrate can have terminals at the surface thereof, and the mounting can include joining at least some of the second portions of the wire bonds with the terminals. The second portions of the wire bonds can be joined with the terminals including reflowing of conductive metal masses joined with the second portions of the wire bonds. At least one of the conductive metal masses can encapsulate at least some of the second portion of a respective one of the wire bonds at least after the reflowing thereof. In an alternative example, the second portions of the wire bonds can be joined with the terminals including reflowing of conductive metal masses joined with the terminals.

The method can further include forming a molded dielectric over at least a portion of the surface of the substrate and extending away therefrom so as to extend along at least a portion of the compliant material layer and along at least a portion of the semiconductor die.

The compliant material layer can be deposited over the semiconductor die so as to cover the wire bonds, including the end surfaces thereof, and forming the compliant material layer can further include removing a portion thereof to form the third surface thereof and to uncover the second portions of the wire bonds. Alternatively, forming the compliant material layer can include molding the compliant material over the semiconductor die so as to form the third surface thereof such that the second portions of the wire bonds extend therefrom.

Forming the wire bond can include severing a wire segment joined with one of the conductive elements at least by pressing the wire segment into contact with a secondary surface using a capillary of a bonding tool so as to form the end surface of the wire bond remote from the base.

BRIEF DESCRIPTION OF THE DRAWINGS

FIGS. 3A-3C are schematic views of example wire bonds that can be used in the microelectronic element of FIG. 1.

FIG. 4 is a detail view of a tip of the example wire bonds of FIGS. 3A-3C.

DETAILED DESCRIPTION

Figure 1:
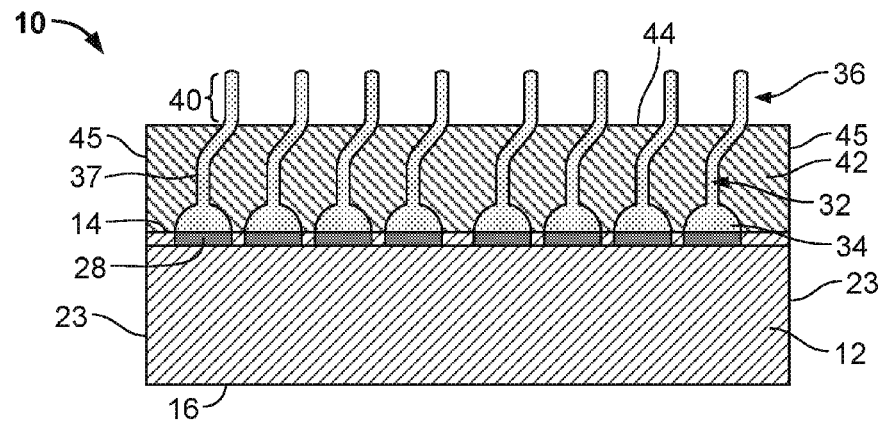
FIG. 1 is a sectional view depicting a microelectronic element according to an aspect of the disclosure.

Turning now to the figures, where similar numeric references are used to indicate similar features, there is shown in FIG. 1 a microelectronic structure that can be in the form of a microelectronic element 10 according to an embodiment of the present invention. The embodiment of FIG. 1 is a microelectronic element 10 in the form of a semiconductor die 12 (also referred to as a semiconductor chip) having a plurality of wire bonds 32 extending from conductive elements 28 thereof to extending portions 40 thereof that extend above a compliant material layer 42 that covers and separates remaining portions of the wire bonds 32 from each other, including portions thereof adjacent semiconductor die 12. The structure can then be used in computer or other electronic applications either alone or in an assembly with further components.

The microelectronic element 10 of FIG. 1 includes semiconductor die 12 having a first surface 14 and a second surface 16. For purposes of this discussion, the first surface 14 may be described as being positioned opposite or remote from second surface 16. Such a description, as well as any other description of the relative position of elements used herein that refers to a vertical or horizontal position of such elements is made for illustrative purposes only to correspond with the position of the elements within the Figures, and is not limiting.

Conductive elements 28 are at the first surface 14 of semiconductor die 12. As used in the present description, when an electrically conductive element is described as being "at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is at a surface of a dielectric structure may project from such surface; may be flush with such surface; or may be recessed relative to such surface and exposed through a hole or depression in the dielectric. Conductive elements 28 can be flat, thin elements of a solid metal material such as copper, gold, nickel, or other materials that are acceptable for such an application, including various alloys including one or more of copper, gold, nickel or combinations thereof. In one example, conductive elements 28 can be substantially circular.

Microelectronic element 10 further includes a plurality of wire bonds 32 joined to at least some of the conductive elements 28. Wire bonds 32 are joined at a base 34 thereof to the conductive elements 28 and extend to a corresponding free end 36 remote from the base 34 and from the first surface 14 of semiconductor die 12, the free ends 36 being within the extending portions 40 of the wire bonds 32. The ends 36 of wire bonds 32 are characterized as being free in that they are not connected or otherwise joined to semiconductor die 12 or any other conductive features within microelectronic element 10 that are, in turn, connected to semiconductor die 12. In other words, free ends 36 are available for electronic connection, either directly or indirectly as through a solder ball or other features discussed herein, to a conductive feature of a component external to microelectronic element 10, such as, for example, a printed circuit board ("PCB") or another substrate with conductive contacts or terminals thereat. The fact that ends 36 held in a predetermined neutral position by, for example, compliant material layer 42 (as described further below) or otherwise joined or electrically connected to another external component does not mean that they are not "free". Conversely, base 34 is not free as it is either directly or indirectly electrically connected to semiconductor die 12, as described herein. As shown in FIG. 1, base 34 can be substantially rounded in shape, extending outward from an edge surface 37 (as shown, for example, in FIGS. 3A-C) of wire bond 32 defined between base 34 and end 36.

The particular size and shape of base 34 can vary according to the type of material used to form wire bond 32, the desired strength of the connection between wire bond 32 and conductive element 28, or the particular process used to form wire bond 32. Example methods for making wire bonds 32 are and are described in U.S. Pat. No. 7,391,121 to Otremba and in U.S. Pat. App. Pub. Nos. 2012/0280386 ("the '386 Publication") and 2005/0095835 ("the '835 Publication," which describes a wedge-bonding procedure that can be considered a form of wire bonding) the disclosures of which are incorporated herein by reference in their entireties.

Wire bonds 32 can be made from a conductive material such as copper, gold, nickel, solder, aluminum or the like. Additionally, wire bonds 32 can be made from combinations of materials, such as from a core of a conductive material, such as copper or aluminum, for example, with a coating applied over the core. The coating can be of a second conductive material, such as aluminum, nickel or the like. Alternatively, the coating can be of an insulating material, such as an insulating jacket. In an example, the wire used to form wire bonds 32 can have a thickness, i.e., in a dimension transverse to the wire's length, of between about 15 µm and 150 µm. In other examples, including those in which wedge bonding is used, wire bonds 32 can have a thickness of up to about 500 µm. In general, a wire bond is formed on a conductive element, such as conductive element 28 within contact portion 30 using specialized equipment.

As described further below, during formation of a wire bond of the type shown and described herein, a leading end of a wire segment is heated and pressed against the receiving surface to which the wire segment bonds, typically forming a ball or ball-like base 34 joined to the surface of the conductive element 28. The desired length of the wire segment to form the wire bond is drawn out of the bonding tool, which can then cut the wire bond at the desired length. Wedge bonding, which can be used to form wire bonds of aluminum, for example, is a process in which the heated portion of the wire is dragged across the receiving surface to form a wedge that lies generally parallel to the surface. The wedge-bonded wire bond can then be bent upward, if necessary, and extended to the desired length or position before cutting. In a particular embodiment, the wire used to form a wire bond can be cylindrical in cross-section. Otherwise, the wire fed from the tool to form a wire bond or wedge-bonded wire bond may have a polygonal cross-section such as rectangular or trapezoidal, for example.

Figure 2:
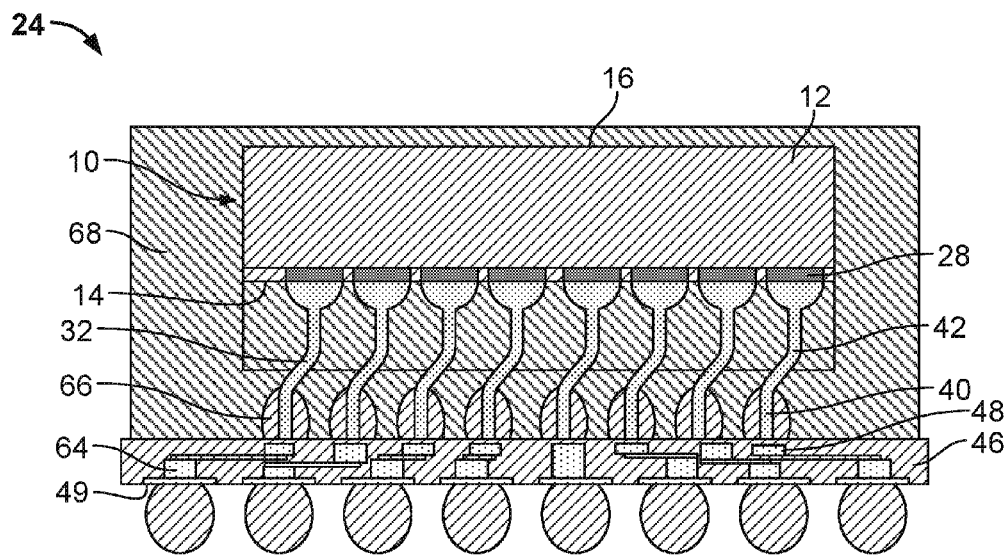
FIG. 2 is a sectional view of a microelectronic package including the microelectronic element of FIG. 1.

The extending portions 40 of the wire bonds 32 can form at least a part of a connection feature in an array formed by respective extending portions 40 of a plurality of wire bonds 32. Such an array can be formed in an area array configuration, variations of which could be implemented using the structures described herein. Such an array can be used to electrically and mechanically connect the microelectronic element 10 to another microelectronic structure, such as to a printed circuit board ("PCB"), a substrate (in a packaged configuration for microelectronic element 10, an example of which is shown in FIG. 2), or to other external components or structures. Conductive metal masses 66 (FIG. 2) can be used to connect the wire bonds 32 to conductive features of such components or structures such as by electronically and mechanically attaching extending portions 40 thereof, including free ends 36 and corresponding end surfaces 38 (FIGS. 3A-3C), thereto.

Microelectronic element 10 further includes a compliant material layer 42 formed from a dielectric material having a Young's modulus of less than about 2.5 GPa. As shown in FIG. 1, compliant material layer 42 extends over the portions of first surface 14 of semiconductor die 12 that are not otherwise covered by or occupied by bases 34 of wire bonds 32. Similarly, compliant material layer 42 extends over the portions of conductive elements 28 that are not otherwise covered by bases 34 of wire bonds 32. Compliant material layer 42 can also partially cover wire bonds 32, including the bases 34 and at least a portion of edge surfaces 37 thereof. Extending portion 40 of wire bonds 32 remains uncovered by compliant material layer 42, thereby making the wire bonds 32 available for electrical connection to a feature or element located outside of compliant material layer 42, as discussed above. In the examples shown in the Figures, a surface, such as major surface 44 of compliant material layer 42 can be spaced apart from first surface 14 of semiconductor die 12 at a distance great enough to cover, for example, bases 34 and portions of the edge surfaces 37 of wire bonds 32 to provide some level of mechanical support therefor and to separate and electrically insulate the wire bonds 32 from each other. Other configurations for compliant material layer 42 are possible. For example, a compliant material layer can have multiple surfaces with varying heights.

The example of wire bonds 32 shown in FIG. 1, which are shown in further detail in FIGS. 3A and 4, define a particular curved shape that can be imparted on the wire bonds 32 by a process of making the wire bonds 32 that utilizes a secondary surface. Such a method is further described below in connection with FIGS. 7-13. The shape of wire bonds 32 can be such that the end surfaces 38 are aligned along an axis 50 with a base end 35 of the wire bond 32 that is immediately adjacent the base 34. In the example of wire bond 32 shown in FIG. 3A, the axis is generally perpendicular to the conductive element 28 such that the end surface 38 is positioned directly above the base end 35. Such a configuration can be useful for a plurality of wire bonds 32 in an array wherein the array of connections on major surface 44 of compliant material layer 42 are intended to have a pitch that generally matches a pitch of the conductive elements 28 to which the wire bonds 32 are respectively joined. In such a configuration, the axis 50 can also be angled with respect to contact portion 30 such that end surface 38 is offset slightly from the base end 35 but is still positioned above base 34. In such an example, the axis 50 can be at an angle of 85° to 90° with respect to contact portion 30.

Wire bond 32 can be configured such that a first portion 52 thereof, on which the end surface 38 is defined, extends generally along a portion of the axis 50. The first portion 52 can have a length that is between about 10% and 50% of the total length of wire bond 32 (as defined by the length of axis 50, for example). A second portion 54 of the wire bond 32 can be curved, or bent, so as to extend away from the axis from a location adjacent the first portion 52 to an apex 56 that is spaced apart from the axis 50. The second portion 54 is further curved so as to be positioned along axis 50 at a location at or near base end 35 and to also extend away from the axis 50 to apex 56 from the side of base end 35. It is noted that first portion 52 need not be straight or follow axis 50 exactly and that there may be some degree of curvature or variation therein. It is also noted that there may be abrupt or smooth transitions between first portion 52 and second portion 54 that may themselves be curved. It is noted, however, that the wire bonds 32 depicted in FIGS. 1 and 3A, including second portion 54, are further configured to lie on a single plane on which axis 50 also lies.

Further, both first 52 and second 54 portions of the wire bond 32 can be configured such that any portions thereof that do not intersect axis 50 are all on the same, single side of axis 50. That is, some of first and second portions 52 and 54 may be, for example, on a side of axis 50 opposite the apex 56 of the curved shape defined by second portion 54; however, any such portions would be in areas of the wire bond 32 that axis 50 intersects at least partially. In other words, first and second portions 52 and 54 of wire bond 32 can be configured to not fully cross axis 50 such that the edge surface 37 within those portions is only spaced apart from axis 50 on a single side of axis 50. In the example of FIG. 3A the plane can be along the page on which the illustration of wire bond 32 is presented.

FIGS. 3B and 3C show examples of wire bonds 32 with ends 36 that are not positioned directly above the respective bases 34 thereof. That is, considering first surface 14 of semiconductor die 12 as extending in two lateral directions, so as to substantially define a plane, an end 36 of one of the wire bonds 32 can be displaced in at least one of these lateral directions from a corresponding lateral position of base 34. As shown in FIGS. 3B and 3C, wire bonds 32 can be of the same general shape as the wire bonds of FIG. 3A and can have an end 36 that is aligned with the portion of the wire bond 32 immediately adjacent the base 34 thereof to define an axis 50. The wire bonds 32 can, similarly, include a first portion 52 that extends generally along axis 50 and a second portion 54 that is curved so as to define an apex 56 that is spaced apart from axis 50 on a single side thereof to define a plane that extends along axis 50. The wire bonds 32 of FIGS. 3B and 3C, however, can be configured such that the axis 50, defined as described above, is angled with respect to contact portion 30 at an angle of, for example, less than 85°. In another example, angle 58 can be between about 30° and 75°.

Wire bond 32 can be such that the apex 56 defined within second portion 54 of wire bond can be either exterior to the angle 58, as shown in FIG. 3B, or interior thereto, as shown in FIG. 3C. Further, axis 50 can be angled with respect to contact portion 30 such that end surface 38 of wire bond 32 is laterally displaced relative to contact portion 30 in multiple lateral directions. In such an example, the plane defined by second portion 54 and axis 50 can itself be angled with respect to conductive element 28 and/or first surface 14. Such an angle can be substantially equal to or different than angle 58. That is the displacement of end 36 relative to base 34 can be in two lateral directions and can be by the same or a different distance in each of those directions.

In an example, various ones of wire bonds 32 can be displaced in different directions and by different amounts throughout microelectronic element 10. Such an arrangement allows for microelectronic element 10 to have an array of extending portions 40 that is configured differently on the level of surface 44 compared to on the level of first surface 14 of semiconductor die 12. For example, an array can cover a smaller overall area or have a smaller pitch on surface 44 than at the first surface 14 of semiconductor die 12. In a variation of the microelectronic element 10 of FIG. 1, wire bonds 32 can be angled as shown in FIG. 3B, FIG. 3C, or a combination thereof.

As shown in FIG. 4, the free ends 36 of at least some of the wire bonds can have an asymmetrical configuration the end surfaces 38 thereof defined on tips 62 of the wire bonds 32 that are narrower than the adjacent portions of thereof, at least in one direction. The narrow tip 62 of the free end 36 can be imparted on wire bond 32 by a process used for manufacture thereof, an example of which is discussed further below. As shown, the narrow tip 62 can be offset such that an axis 60 through the center thereof is offset from an axis 50 through the center of the adjacent portion of the wire bond 32. Further, a centroid 61 of the end surface 38 can be along axis 60 such that it is offset from the adjacent wire bond portion. The tip 62 of wire bond 32 may also be narrowed in a direction perpendicular to the dimensions shown in FIG. 11 or can be the same width as the adjacent portion of wire bond 32 or can be somewhat wider. The extending portions 40 of the wire bonds 32 may include all or part of the tips 62 of wire bonds having such tips or may include the entire tips 62 and portions of the wire bonds extending beyond the tips 62.

As discussed above, wire bonds 32 can be used to connect microelectronic element 10 with an external component. FIG. 2 shows an example of an assembly 24 of a microelectronic element 10 that can be as described in connection with FIG. 1, or any of the variations thereof described in connection therewith. The extending portions 40 of wire bonds 32 are joined with contact pads 48 of a substrate 46 by conductive metal masses 66 that extend along the extending portions 40 of wire bonds 32 and along contact pads 48. Substrate 46 can be in the form of a dielectric element that is substantially flat. The dielectric element may be sheet-like and may be thin. In particular embodiments, the dielectric element can include one or more layers of organic dielectric material or composite dielectric materials, such as, without limitation: polyimide, polytetrafluoro-ethylene ("PTFE"), epoxy, epoxy-glass, FR-4, BT resin, thermoplastic, or thermoset plastic materials. The thickness of substrate 46 is preferably within a range of generally acceptable thicknesses for the desired application and, in an example, can be between about 25 and 500 μm. The substrate 46 can further include terminals 49 opposite the contact pads 48 in the same or different array configuration. The terminals 49 can be connected with the contact pads 48 by routing circuitry 64 within substrate 46.

The assembly 24 can further include a molded dielectric layer 68 that can, for example, be molded over the surface of the substrate 46 facing microelectronic element 10. The molded dielectric layer 68 be an encapsulant, for example, and can fill spaces between the conductive metal masses 66 and can contact the substrate 46 and the major surface 44 of the compliant material layer 42 in the area therebetween. Molded dielectric layer 68 can further extend outwardly along substrate 46 and upwardly along the edge surfaces 45 and 23 of the compliant material layer 42 and of semiconductor die 12, respectively, and can optionally cover microelectronic element 10 by extending over second surface 16 of semiconductor die 12. Substrate 46 can include package terminals opposite contact pads 48 or other structures to facilitate connection of the package assembly 24 with an external component.

In another example, a microelectronic element can similarly be joined directly with a printed circuit board ("PCB") in place of substrate 46. Such a PCB can be assembled within an electronic device such that connection of microelectronic element 10 with the PCB can be done in assembling microelectronic element 10 with such a device. Further, such assembling can be carried out without the incorporation of a molded dielectric.

In either such assembly or application of a microelectronic element 10 as described herein, the structure of the wire bonds 32, along with the incorporation of compliant material layer 42 according to the principles described herein, can help improve the reliability of the attachment of microelectronic element 10 with a substrate in a package assembly or with a PCB (or other component). In particular, the reliability of the connections therebetween, which in the case of microelectronic element 10, is made between the extending portions 40 of wire bonds 32 and corresponding conductive features of the connected component (e.g. contact pads 48) can be improved relative to, for example, a direct connection between contacts of a semiconductor die and terminals of a substrate. This improvement can be accomplished by the ability of wire bonds 32 to flex or bend to accommodate relative movement between the conductive elements 28 of semiconductor die 12 and the contact pads 48 of substrate 46 (or PCB or other similar structure). Such movement can be caused by handling of the components, movement of the device, e.g., in which microelectronic element 10 or an assembly thereof is used, or testing of the microelectronic element 10 or assembly 24. Further, such relative movement can be caused by expansion and corresponding contraction of the components during the use cycle thereof caused by heat generated by the components and/or surrounding structures. Such thermal expansion is related to the coefficient of thermal expansion ("CTE") of the components, and the relative movement between components in different structures can be caused by a difference, or mismatch, in the CTEs of the various structures or the materials thereof. For example, a semiconductor die can have a CTE of between about 2 and 5 parts per million per degree, Celsius (ppm/° C.). In the same assembly, a PCB or substrate can have a CTE of 15 ppm/° C. or greater.

The CTE of either component can be a "composite" CTE, which refers to a the CTE of the finished structure, which can approximate, but may not exactly match, the CTE of the primary material from which such a structure is constructed and can depend on the construction of the structure and the presence of other materials with different CTEs. In an example, the CTE of the semiconductor die can be on the order of Silicon or another semiconductor material, from which the die is primarily constructed. In another example, substrate 46 can have a CTE on the order of PTFE or another dielectric material, from which substrate 46 can be constructed.

Accordingly, a CTE mismatch between materials can cause relative movement between the conductive elements 28 of semiconductor die 12 and the contact pads 48 of substrate 46 (or another structure, such as a PCB or the like) as the semiconductor die 12 and the substrate 46 expand and contract during thermal cycling of the assembly 24 thereof because the semiconductor die 12 and substrate 46 expand at different rates and by different amounts in response to the same temperature change. This can cause displacement of the contact pads 48 with respect to the conductive elements 28, particularly in the peripheral areas of the substrate 46 or the semiconductor die 12 (i.e. toward edge surfaces 23 thereof) or in other areas depending on the particular configurations of the components and/or conductive elements 28 and contact pads 48.

The flexibility of wire bonds 32 along the respective lengths thereof can allow the end surfaces 38 thereof to displace with respect to the bases 34 in a resilient manner. Such flexibility can be used to compensate for relative movement of the associated conductive elements 28 and contact pads 48 between which the wire bonds 32 are connected. Because wire bonds 32 are flexible, however, they may not themselves be able to reliably support semiconductor die 12 relative to substrate 46 or other structure. For example, the flexing of unsupported wire bonds 32 could lead to adjacent wire bonds 32 coming into contact with one another, which could cause shorting or otherwise damage wire bonds 32 or the associated components. Accordingly, compliant material layer 42 is configured to separate wire bonds 32 from each other and to adding to the structural rigidity along the height thereof, while permitting desired flexing of wire bonds 32 to compensate for displacement of contact pads 48 relative to conductive elements 28. Accordingly, compliant material layer 42 can be made of a resiliently deformable (i.e. compliant) composition such as a material with a Young's modulus of less than 2.5 GPa. Further, compliant material layer 42, as mentioned above, can be dielectric so as to electrically insulate the wire bonds 32 from one another without requiring additional coatings or the like. Suitable materials for compliant material layer include silicone, benzocyclobutene ("BCB"), epoxy, or the like.

In such a structure, it may be beneficial to configure microelectronic element 10 to be able to make a connection with semiconductor die 12 with the connection being robust enough to cause and flexing of wire bonds 32 within compliant layer 42 (which requires deformation of compliant layer 42). The extending portions 40 of wire bonds 132 can be configured to achieve such a connection. For example, by being uncovered by compliant material layer 42 so as to be physically separated therefrom, extending portions 40 allow conductive metal masses 66 to completely surround at least some of the edge surfaces 37 of wire bonds 32 within extending portions 40, which can provide a more robust connection than one achieved by a mass 66 that simply extends along a side thereof, for example. To allow adequate access for a conductive metal mass 66 to surround a extending portion 40, the extending portions 40 can be oriented relative compliant material layer 42 such that the axes 50 of wire bonds 32 within extending portions 40 are at an angle of between about 30° and 90° with respect to surface 44. Further, the strength of the bond can be increased by structuring wire bonds 32 and compliant material layer 42 such that extending portions have a height above surface 44 of 200 μm or less. In an example, extending portions 40 can have heights of between 50 and 200 μm.

In some examples where a molded dielectric layer 68 is also included in an assembly 24 with microelectronic element 10, the molded dielectric can itself be compliant, with a Young's modulus that, in an example, can be greater than that of compliant material layer 42 and, in a further example, less than that of either semiconductor die 12 or substrate 46.

Figure 5:
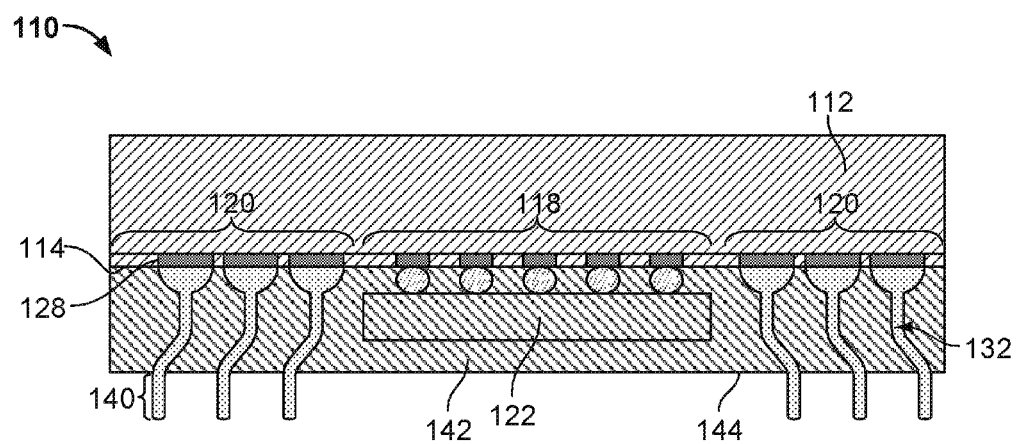
FIG. 5 is a sectional view of an alternative microelectronic element according to another example of the disclosure.
Figure 6:
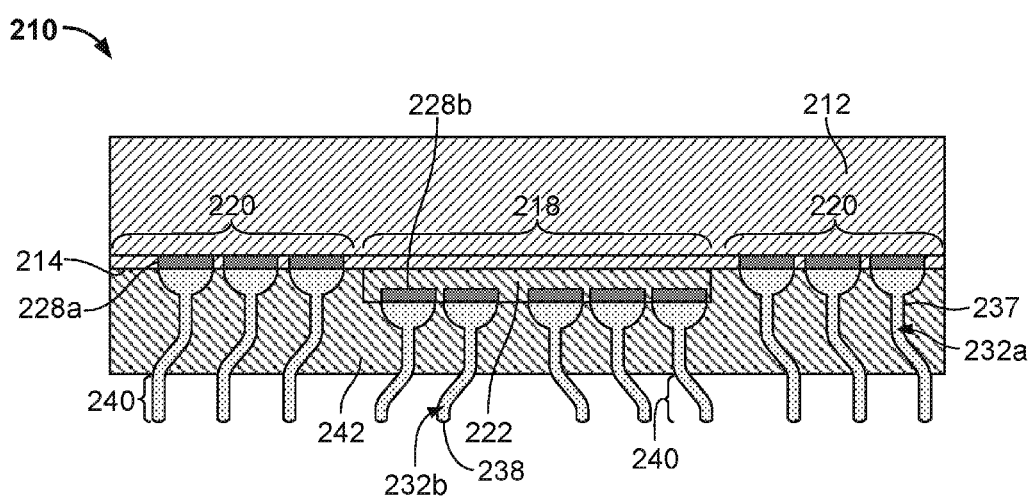
FIG. 6 is a sectional view of an alternative microelectronic element according to another example of the disclosure.

FIGS. 5 and 6 show examples of microelectronic elements 110 and 210 that incorporate multiple semiconductor dies in a stacked arrangement. In the example of FIG. 5, first surface 114 of semiconductor die 112 is considered as being divided into a first region 118 and a second region 120. The first region 118 lies within the second region 120 and includes a central portion of first surface 114 and extends outwardly therefrom. The second region 120 substantially surrounds the first region 118 and extends outwardly therefrom to the outer edges of semiconductor die 112. In this example, no specific characteristic of the semiconductor die 112 physically separates the two regions; however, the regions are demarked for purposes of discussion herein with respect to treatments or features applied thereto or contained therein. The wire bonds 132 are connected with conductive elements 128 at surface 114 within the second region 120.

A second semiconductor die 122 is mounted on semiconductor die 112 within first region 118. In the example shown in FIG. 5, semiconductor die 122 is mounted face down on semiconductor die 112 and is electrically and mechanically joined therewith by conductive metal masses 66 that can be solder masses, for example. In such a structure, conductive elements at the surface of semiconductor die 122 that faces first surface 114 can be connected with routing circuitry at surface 114 of semiconductor die 112 that extends within first region 118. Such routing circuitry can include traces, for example, that extend into second region 120 and connect with some of the conductive elements 128 at surface 114 within second region 120. Other conductive elements 128 are connected to the internal components of semiconductor die 112. As such, wire bonds 132 can be used to facilitate connections with both semiconductor die 112 and semiconductor die 122 at major surface 144 of compliant material layer 142. To achieve such a structure, both wire bonds 132 and compliant material layer 142 can be of a height sufficient for extending portions 140 of wire bonds 132 to be positioned above semiconductor die 122, which can be covered by compliant material layer 142. Microelectronic element 110 can be mounted to a substrate, PCB, or other structure in a manner similar to microelectronic element 10, described above, in which wire bonds 132 within compliant material layer 142 can compensate for a CTE mismatch between components in a similar manner.

In the example of FIG. 6, second semiconductor die 222 is mounted on semiconductor die 212 within first region 218. Semiconductor die 212 has conductive elements 228a disposed within second region 220 surrounding semiconductor die 222 with wire bonds 232a connected therewith. In this example, however, semiconductor die 222 is mounted face-up on semiconductor die 212 such that the conductive elements 228b thereof face away from surface 214 of semiconductor die 212. In this structure, second wire bonds 232b are connected with conductive elements 228b and extend to ends 238 remote from the conductive elements 228b. Compliant material layer 242 covers surface 214 of semiconductor die 212 in areas outside of wire bonds 232a and outside of semiconductor die 222. Compliant material layer further covers semiconductor die 222 such that compliant material layer 242 separates and extends between the edge surfaces 237 of wire bonds 232a and 232b. As such, microelectronic element 210 can be mounted on a substrate, PCB, or other structure by connecting the extending portions 240 of wire bonds 232a and 232b with features of that structure in a manner similar to microelectronic element 10, described above.

In such a structure, it may be desired to configure wire bonds 232a and 232b with heights sufficient to compensate for a CTE mismatch among components, as described above. In this structure, wire bonds 232a and 232b can be configured with a height sufficient to provide a desired height for extending portions 240 and sufficient compensation for displacement of features with which they are connected due to CTE mismatch. Displacement of contact pads on a substrate, for example, relative to the conductive elements 228a may be greater than with respect to conductive elements 228b because displacement is greater towards the peripheries of such structures. Accordingly, wire bonds 232b may have heights that are less than would be necessary within a similarly-sized microelectronic element including only one semiconductor die.

Figure 7:
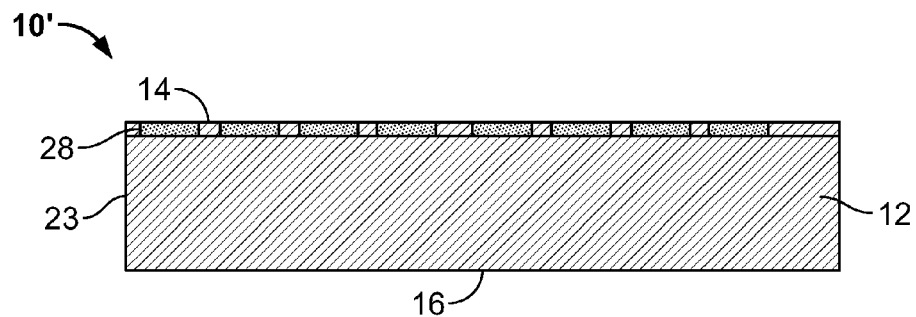
FIGS. 7-12 show various sectional views of an in process unit during steps of a method for fabricating a microelectronic element according to another aspect of the disclosure.
Figure 8:
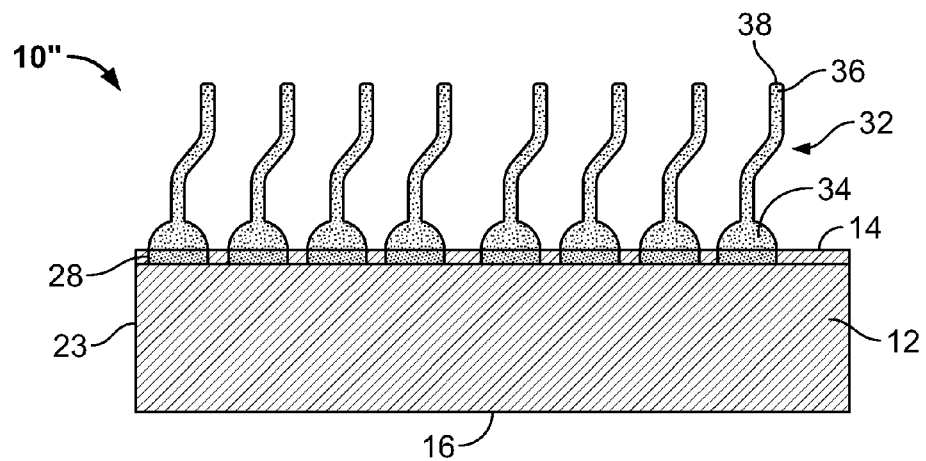

FIGS. 7-12 show a microelectronic element 10 in various steps of a fabrication method thereof. FIG. 7 shows in-process unit 10' consisting of semiconductor die 12, as described above, with conductive elements 28 at first surface 14 thereof. In FIG. 8, in process unit 10" is shown having a wire bonds 32 formed on conductive element 28 of the semiconductor die 12. Such wire bonds can be formed using specially-adapted equipment that can be configured to form a plurality of successive wire bonds in an assembly by heating a leading end of a wire that passes through a bonding capillary. The capillary is aligned with one of the conductive elements 28, which accordingly aligns the leading end of the wire therewith. The base 34 of a wire bond is then formed joined to the conductive element 28 by pressing the heated free end thereagainst by appropriate movement of the capillary.

After a desired length of the wire has been drawn out of the capillary so as to extend above first surface 14 of semiconductor die 12 at an appropriate distance for the height of the wire bond to be formed (which can also include positioning of the wire to achieve a desired location for the free end 36 thereof and/or shaping of the wire bond 32 itself), the wire is severed to detach the wire bond 32 at the end surface 38 from a portion of the wire that remains in the capillary and is used in the formation of a successive wire bond. This process is repeated until the desired number of wire bonds is formed. Various steps and structures can be used to sever the wire bonds 32, including electronic flame-off ("EFO"), various forms of cutting or the like, examples of which are provided in U.S. patent application Ser. Nos. 13/462,158 and 13/404,408, and in U.S. Pat. No. 8,372,741. A further example of wire bond severing is discussed below with respect to FIGS. 14 and 15. In variations of the above-described wire bond formation steps, wire bonds 32 can be formed on the in-process unit 10" by edge bonding steps, including wedge bonding or stitch bonding, using specially-adapted equipment, as described in U.S. patent application Ser. No. 13/404,408.

Figure 9:
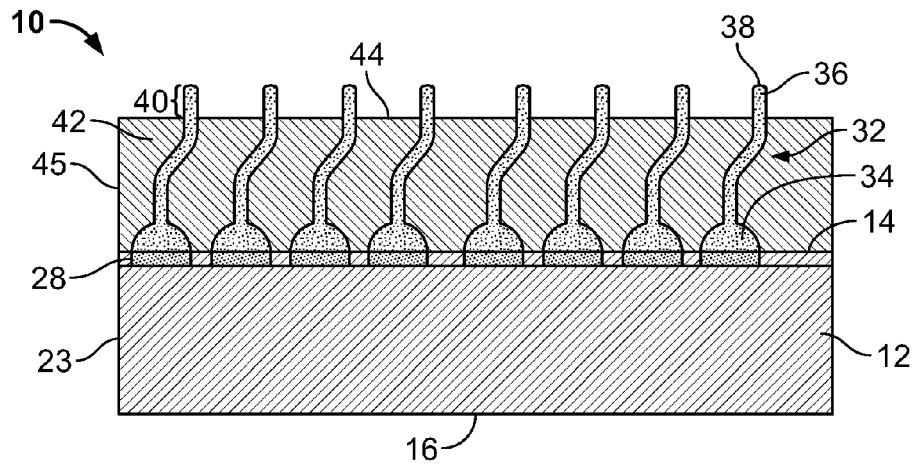

After formation of the desired number of wire bonds 32, compliant material layer 42 can be formed by depositing the desired material in a flowable state over in-process unit 10", as shown in FIG. 9, before being allowed to harden or cure in place. This can be done by placing the unit 10' in an appropriately-configured mold having a cavity in the desired shape of the compliant material layer 42 that can receive unit 10'. Such a mold and the method of forming a compliant material layer therewith can be done in a procedure similar to the procedure for forming an encapsulation layer over wire bonds on a substrate that is shown and described in U.S. Pat. App. Pub. No 2010/0232129, the disclosure of which is incorporated by reference herein in its entirety. Compliant material layer 42 can be formed such that, initially, surface 44 thereof is spaced above end surfaces 38 of wire bonds 32. To form extending portions 40, including end surfaces 38, the portion of compliant material layer 42 that is above end surfaces 38 can be removed, creating a new surface 44 that is positioned below end surfaces 38. Alternatively, compliant material layer 42 can be formed such that surface 44 is initially below end surfaces 38 at a distance to define the desired height of detached portions 40. Removal, if necessary, of a portion of compliant material layer 42 can be achieved by grinding, dry etching, laser etching, wet etching, lapping, or the like. If desired, a portion of the free ends 36 of wire bonds 32 can also be removed in the same, or an additional, step to achieve substantially planar end surfaces 38 that are substantially even with each other.

As discussed above, the microelectronic element 10 resulting from the above steps, or variations thereof, can be packaged on a substrate or mounted on a PCB. Either of these subsequent steps can be carried out in a similar manner. In an example shown in FIG. 10, microelectronic element 10 can be prepared for bonding with an external component by depositing conductive metal masses 66, which can be of solder or the like over the extending portions 40 of wire bonds 32. The masses 66 can be allowed to cool and solidify so that the masses 66 remain at least temporarily fixed in the locations on respective extending portions 40. As shown in FIG. 11, the microelectronic element 10 from FIG. 10 can be aligned with a PCB 90 with the masses 66, and accordingly the extending portions 40 of the wire bonds 32, aligned with contact pads 92 of the PCB. The masses 66 can then be brought into contact with the pads 92 and heated to reflow the conductive material to join it with the pads 92 and to fix microelectronic element 10 to PCB 90, as shown in FIG. 12.

Figure 10:
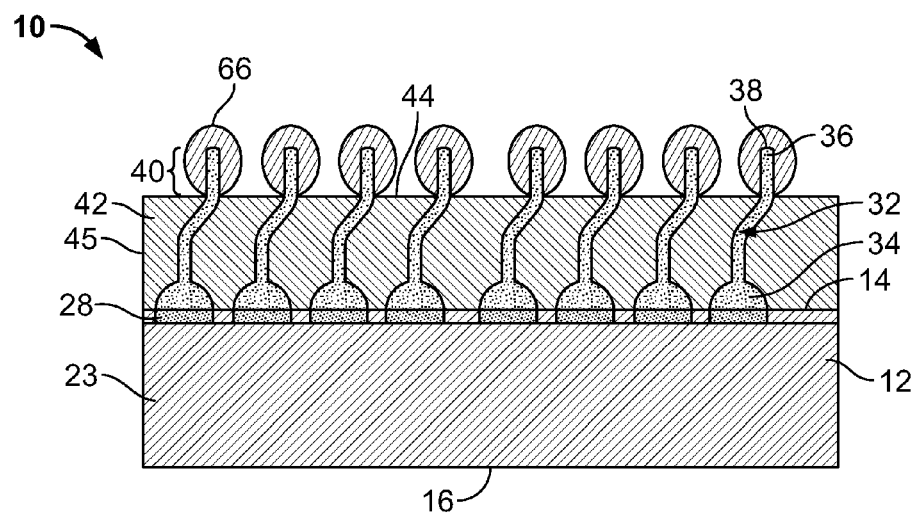
Figure 11:
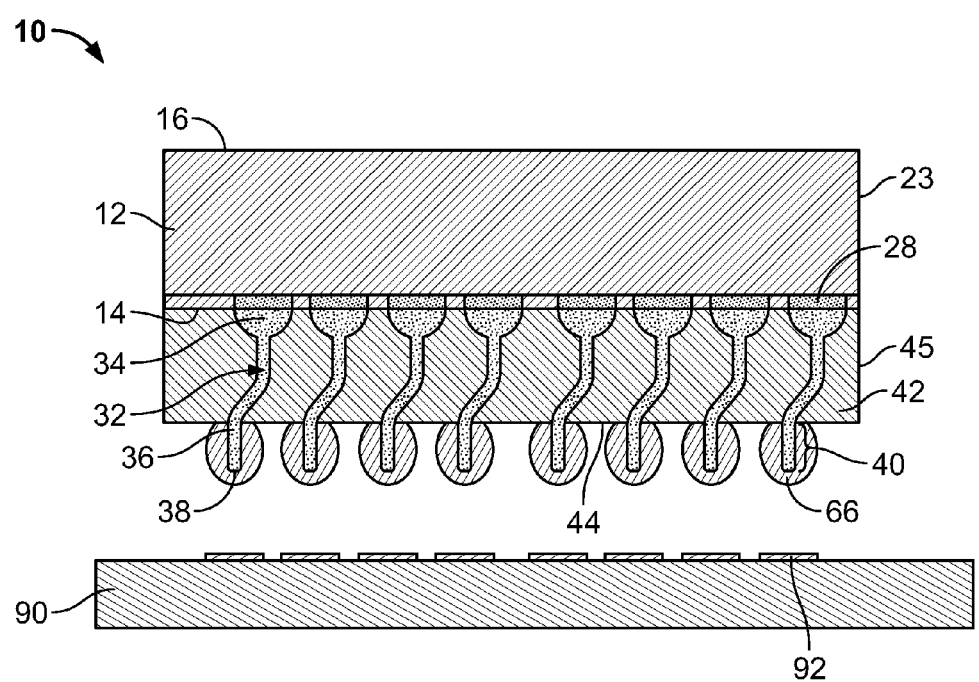
Figure 12:
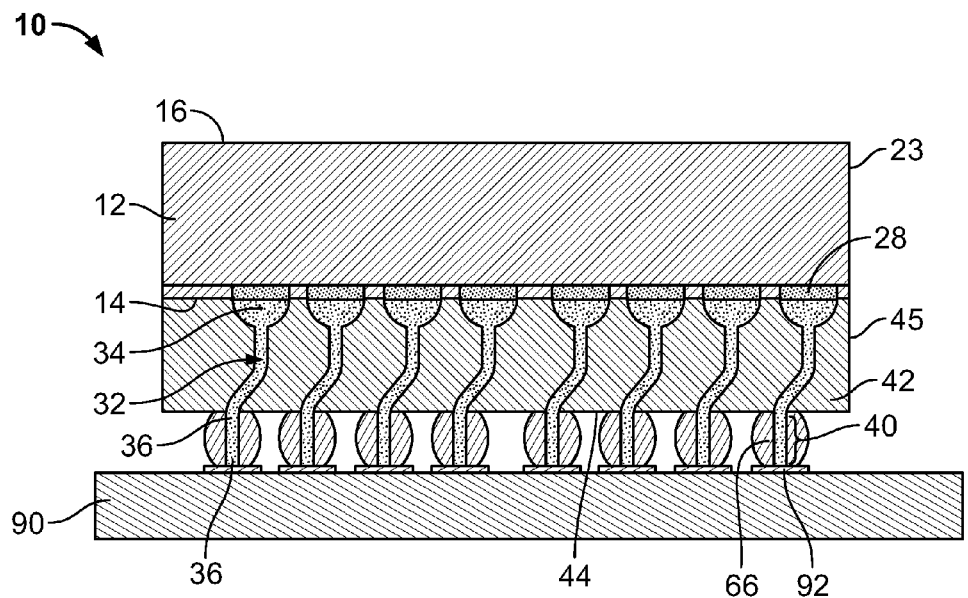
Figure 13:
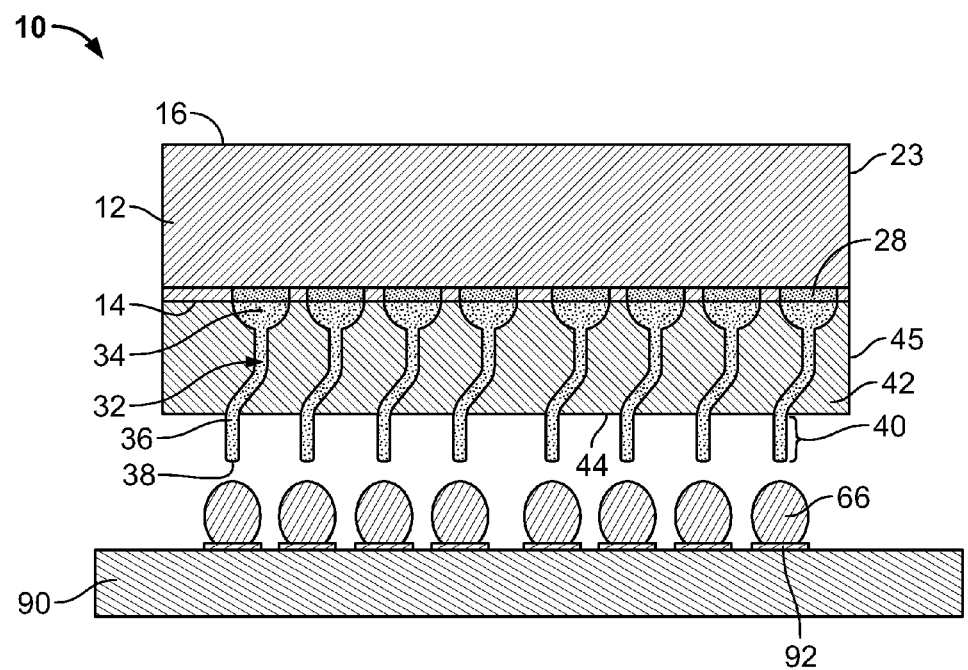
FIG. 13 shows a method step that can be used in a variation of the method depicted in FIGS. 7-12

In a variation of the mounting steps of FIGS. 10-12, conductive metal masses 66 can be deposited on contact pads 92, as shown in FIG. 13 in preparation for microelectronic element mounting. Microelectronic element 10 can then be positioned over PCB 90 with extending portions 40 of wire bonds 32 aligned with the masses 66 (and, thus, with contact pads 92). The masses 66 can be heated to cause reflow and microelectronic element 10 can be moved toward PCB 90 such that extending portions 40 are positioned within masses 66, which can then be allowed to cool to join with extending portions 40.

Either of the above-discussed steps (from FIGS. 10 12 and 13) can also be used to join a microelectronic element 10, formed as described above, to a substrate 46 in a package assembly 24, as described above with respect to FIG. 2. Such a package assembly 24 can be further processes to deposit molded dielectric layer 68 thereon, as shown in FIG. 2, which can be done using molding or other methods used elsewhere for molded dielectric formation in microelectronic packaging. Alternatively, an underfill can be deposited in the area between the microelectronic element 10 and the substrate 46 surrounding the conductive metal masses 66.

Variations of the above-described method steps can also be used to form and package or mount the multi-die arrangements shown in FIGS. 5 and 6. In such variations, second die 122 or 222 can be mounted on die 112 or 212 before or after wire bond formation (which can be done by any of the methods discussed herein). In the example of FIG. 6, mounting die 222 on die 212 before wire bond formation could result in the wire bonds 232 being formed all at once, instead of in subsequent steps. After die mounting and wire bond formation, the compliant material layers 142 and 242 can be deposited as discussed above, and the packages can be mounted, as previously discussed and in the same manner as single die microelectronic element 10.

Figure 14:
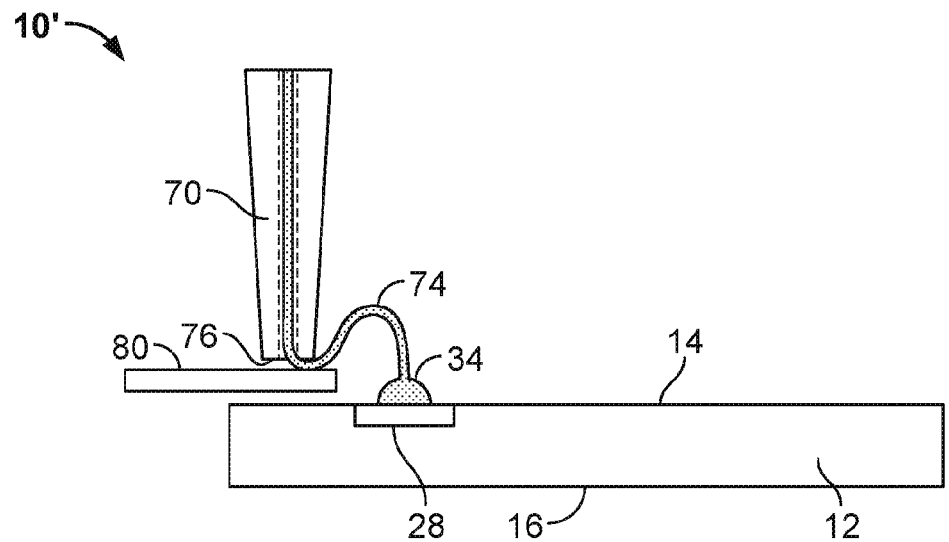
FIGS. 14 and 15 show schematic views of successive steps in a method for fabricating a wire bond that can be incorporated in the method depicted in FIGS. 7-12 and the variation incorporating the step of FIG. 13.
Figure 15:
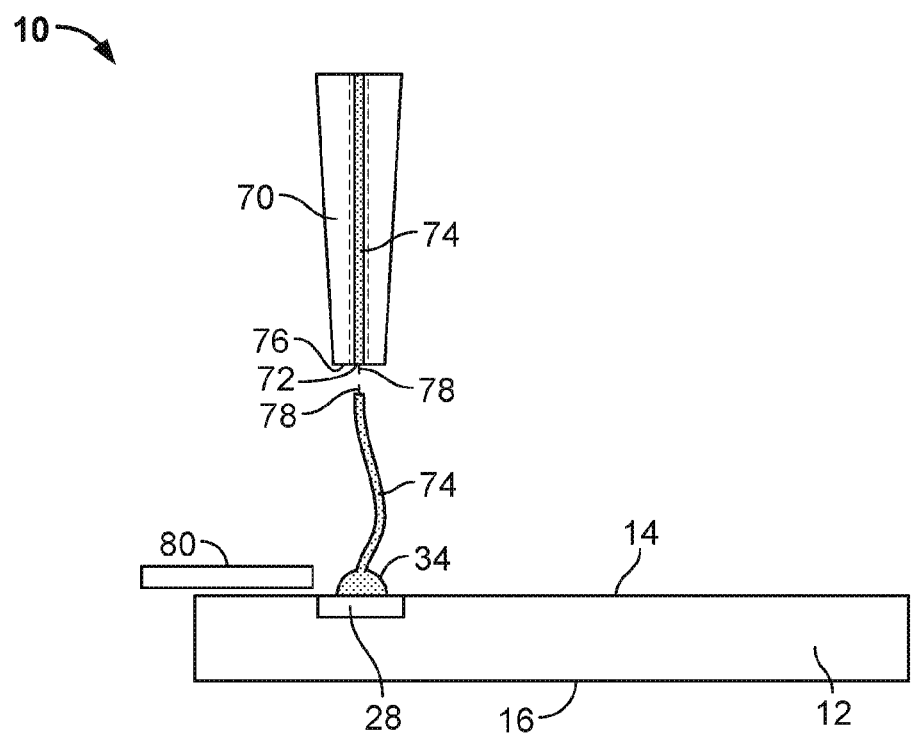

FIGS. 14 and 15 show an in-process unit 10' during particular method steps that can be used in wire bond formation. As shown in FIG. 14, capillary 70 of a wire bonding tool in proximity to the first surface 14 of semiconductor die 12. The capillary 70 shown schematically in FIG. 4, along with the bonding tool (not shown) with which it is associated can be of the type generally described above and can join the bases 34 of wire bonds 32 to the conductive elements 28 of semiconductor die 12.

In this particular set of method steps, after a desired length of the wire 74 has been drawn out of capillary 70 for the desired height of the wire bond to be formed, the wire 74 is severed and appropriately positioned using a face 76 of the capillary 70 and a secondary surface 80. As shown in FIG. 14, the severing and positioning is started by moving capillary 70 to a position over a secondary surface 80, which is shown schematically as a surface of an element in FIG. 14. In various applications, the secondary surface 80 can be on an element of sufficient hardness for the severing application described below such as metal or the like. Such an element can be attached with the bonding tool in a position to follow capillary 70 as it is moved during the wire bonding process. In another example, the element can be fixed relative to the bonding tool in the area of the semiconductor die 12.

In the example shown in FIG. 14, the capillary 70 is positioned over the secondary surface 80. After capillary 70 is appropriately positioned, it is pressed toward secondary surface 80 with a portion of the wire 74 between secondary surface 80 and a face 76 of capillary 70 that extends outwardly from wire 74. Pressure is then applied to the wire to move face 76 toward secondary surface 80, which compresses wire 74 therebetween, causing plastic deformation of wire 74, e.g., flattening or constriction of the wire, in area 78. Through such deformation, area 78 of wire 74 becomes somewhat weaker than the remaining portions of wire 74 on either side thereof and weaker than the joint between base 34 and contact portion 30. For example, area 78 may be somewhat flattened, constricted, or twisted relative to other portions of the wire 74 on either side thereof.

After deformation of area 78 of wire 74, the capillary 70 is then moved back toward a final desired position for the free end 36 of the wire bond 32 to-be formed. This position can be directly above base 34 or can be laterally displaced therefrom, as discussed above with respect to the examples of FIGS. 3B and 3C. The position of capillary 70 can be generally in the desired lateral area of free end 36 and can be just somewhat closer to first surface 14 than the desired final position. Further, the wire may remain partially bent, including a shape similar to the shape of the finished wire bonds 32 discussed above including a first portion 52 and second portion 54.

Capillary 70 can then be moved away from surface 14 to apply tension to the segment of wire 74 (which can be clamped or otherwise secured within capillary 70) between capillary 70 and base 34. This tension causes wire 74 to break within area 78, as shown in FIG. 15, which separates wire bond 32 from the remaining portion of wire 74 with a portion of area 78 forming the tip 62 of free end 36 with end surface 38 defined thereon. A remaining portion of area 78 remains on a new leading end 72 of the wire 74. These steps can be repeated on other conductive elements 28 at the surface 14 of the semiconductor die 12 to form an array of wire bonds 32 in a desired pattern.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic structure, comprising:
a first semiconductor die having a first surface, the first surface having a first region and a second region, a plurality of first electrically conductive elements at the first surface of the first semiconductor die;
a second semiconductor die mounted on the first semiconductor die within the first region the second semiconductor die has a front surface and a plurality of second electrically conductive elements at the front surface, wherein the front surface of the second semiconductor die faces away from the first surface of the first semiconductor die;
first wire bonds having bases joined to respective ones of the first conductive elements, the first wire bonds further having end surfaces remote from the bases, the first wire bonds defining edge surfaces extending between the bases and the end surfaces thereof; and
a compliant material layer overlying the first surface of the first semiconductor die and overlying the second semiconductor die, the compliant material layer contacting edge surfaces of first portions of the first wire bonds and fully encapsulating each first portion such that the first portions of the first wire bonds are separated from one another by the compliant material layer, the compliant material layer further having a surface facing away from the first surface of the first semiconductor die, wherein second portions of the first wire bonds including the end surfaces are disposed above the surface of the compliant material layer, the second portions configured to connect with contacts of a substrate external to the microelectronic structure, the microelectronic structure further comprising a plurality of second wire bonds having bases joined to the second electrically conductive elements and having free ends remote from the bases of the second wire bonds, the free ends of the second wire bonds remote from the first surface of the second semiconductor die, and the free ends of the second wire bonds including end surfaces of the second wire bonds, the second wire bonds defining edge surfaces extending between the bases of the second wire bonds and the end surfaces of the second wire bonds, wherein the compliant material layer overlies the first surface of the second semiconductor die and contacts the edge surfaces of first portions of the second wire bonds, wherein second portions of the second wire bonds are defined by the end surfaces of the second wire bonds and portions of the edge surfaces of the second wire bonds extending from the end surfaces of the second wire bonds that are uncovered by and project above the surface of the compliant material layer overlying the front surface of the second semiconductor die.

2. The microelectronic structure of claim 1, wherein the second portions of the first wire bonds are moveable with respect to the bases thereof.

3. The microelectronic structure of claim 1, wherein the compliant material layer has a Young's modulus of 2.5 GPa or less.

4. The microelectronic structure of claim 1, wherein the second portions of the first wire bonds extend along axes of the first wire bonds that are disposed at angles of at least 30 degrees with respect to the first surface of the compliant material layer.

5. The microelectronic structure of claim 1, wherein the end surfaces of the first wire bonds are positioned above the first surface of the compliant material layer by a distance of at least 50 microns.

6. The microelectronic structure of claim 1, wherein the first semiconductor die has a second surface opposite the first surface and a plurality of edge surfaces extending between the first and second surfaces, and wherein the compliant material layer further includes edge surfaces extending from the first surface of the compliant material layer thereof to the first surface of the first semiconductor die, the edge surfaces of the compliant material layer being substantially coplanar with the edge surfaces of the first semiconductor die.

7. The microelectronic structure of claim 1, wherein a first one of the first wire bonds has a shape such that the first one of the first wire bonds defines an axis between a free end of the first one of the first wire bonds and the base of the first one of the first wire bonds and such that the first one of the first wire bonds defines a plane, a bent portion of the first one of the first wire bonds extending away from the axis within the plane.

8. The microelectronic structure of claim 7, wherein the shape of the first one of the first wire bonds is further such that a substantially straight portion of the first one of the first wire bonds extends between the free end of the first one of the first wire bonds and the bent portion along the axis.

9. The microelectronic structure of claim 1, wherein the second region surrounds the first region of the first surface of the first semiconductor die.

10. A microelectronic structure, comprising:
a first semiconductor die having a first surface, the first surface having a first region and a second region, a plurality of first electrically conductive elements at the first surface of the first semiconductor die;
a second semiconductor die mounted on the first semiconductor die within the first region, the second semiconductor die has a front surface and a plurality of second electrically conductive elements at the front surface, wherein the front surface of the second semiconductor die faces away from the first surface of the first semiconductor die;
a plurality of first wire bonds having bases joined to respective ones of the first conductive elements, the first wire bonds further having end surfaces remote from the bases, the first wire bonds defining edge surfaces extending between the bases and the end surfaces thereof; and
a compliant material layer overlying the first surface of the first semiconductor die and overlying the second semiconductor die, the compliant material layer contacting edge surfaces of first portions of the first wire bonds and fully encapsulating each first portion such that the first portions of the first wire bonds are separated from one another by the compliant material layer, the compliant material layer further having a surface facing away from the first surface of the first semiconductor die, wherein second portions of the first wire bonds including the end surfaces are disposed above the surface of the compliant material layer, the second portions configured to connect with contacts of a substrate external to the microelectronic structure,
wherein the first portions of the first wire bonds are movable within the compliant material layer by deformation of the compliant material layer, such that, in a state of the microelectronic structure assembled with the substrate and the second portions of the first wire bonds connected with contacts of the substrate, such movement of the first wire bonds compensates for displacement of the contacts relative to the first conductive elements, such as caused by differential thermal expansion between the first semiconductor die and the substrate,
the microelectronic structure further comprising a plurality of second wire bonds having bases joined to the second electrically conductive elements and having free ends remote from the bases of the second wire bonds, the free ends of the second wire bonds remote from the first surface of the second semiconductor die, and the free ends of the second wire bonds including end surfaces of the second wire bonds, the second wire bonds defining edge surfaces extending between the bases of the second wire bonds and the end surfaces of the second wire bonds,
wherein the compliant material layer overlies the first surface of the second semiconductor die and contacts the edge surfaces of first portions of the second wire bonds, wherein second portions of the second wire bonds are defined by the end surfaces of the second wire bonds and portions of the edge surfaces of the second wire bonds extending from the end surfaces of the second wire bonds that are uncovered by and project above the surface of the compliant material layer overlying the front surface of the second semiconductor die.

11. The microelectronic structure of claim 10, wherein the second portions of the wire bonds are moveable with respect to the bases thereof.

12. The microelectronic structure of claim 10, wherein the first semiconductor die has a second surface opposite the first surface and a plurality of edge surfaces extending between the first and second surfaces, and wherein the compliant material layer further includes edge surfaces extending from the first surface of the compliant material layer thereof to the first surface of the first semiconductor die, the edge surfaces of the compliant material layer being substantially coplanar with the edge surfaces of the first semiconductor die.

* * * * *